US006324602B1

United States Patent
Chen et al.

(10) Patent No.: US 6,324,602 B1
(45) Date of Patent: Nov. 27, 2001

(54) ADVANCED INPUT/OUTPUT INTERFACE FOR AN INTEGRATED CIRCUIT DEVICE USING TWO-LEVEL TO MULTI-LEVEL SIGNAL CONVERSION

(75) Inventors: Jawji Chen, Fremont; Shuen-Chin Chang, San Jose; Yong E. Park, Los Altos, all of CA (US)

(73) Assignee: Integrated Memory Logic, Inc., Santa Clara, CA (US)

( * ) Notice: Subject to any disclaimer, the term of this patent is extended or adjusted under 35 U.S.C. 154(b) by 0 days.

(21) Appl. No.: 09/135,986

(22) Filed: Aug. 17, 1998

(51) Int. Cl.[7] .......................... G06F 13/38; H04L 25/49; H03M 5/02
(52) U.S. Cl. .............................. 710/68; 710/105; 710/74; 375/287; 341/56
(58) Field of Search ............... 326/59, 60; 710/105–106, 710/65–74; 375/286–294; 341/56, 57

(56) References Cited

U.S. PATENT DOCUMENTS

| | | | | |
|---|---|---|---|---|
| 3,601,702 | * | 8/1971 | Lender | 371/56 |
| 3,649,751 | * | 3/1972 | So | 358/262.1 |
| 3,723,875 | * | 3/1973 | Kawashima et al. | 375/214 |
| 3,723,880 | * | 3/1973 | Gerwen | 375/286 |
| 3,761,818 | * | 9/1973 | Tazaki et al. | 375/293 |
| 3,838,214 | * | 9/1974 | Lind | 375/294 |
| 3,943,284 | * | 3/1976 | Nelson | 370/282 |

(List continued on next page.)

OTHER PUBLICATIONS

Direct Rambus, "RIMM Module 128 Mbytes (64M ×16/18)," Rambus Inc., Advance Information, Oct. 1997, pp. 1–15.

"Direct Rambus Technology: The New Main Memory Standard," Richard Crisp, IEEE Micro, Nov./Dec. 1997, pp. 18–28.

"1.6 GB/Sec Memory," Direct Rambus Technology Disclosure, Oct. 15, 1997, pp. 1–16.

"1M ×16Bit ×4 Banks Double Data Rate Synchronous DRAM with Bi–directional Data Strobe," Samsung Electronics, Rev. 0.5 Jun. 1997.

"RIMM Serial Presence Detect Application Note,"Rambus Inc., Advance Information, Oct. 1997, pp. 1–7.

"Direct RDRAM 64/72–Mbit (256Kx 16/18x16d)," Rambus Ins., Advance Information, Oct. 1997, pp. 1–48.

"Direct Rambus Memory Controller," Rambus Inc., Feb. 4, 1998, pp. 1–2.

"Base/Concurrent Rambus Layout Guide," Rambus Inc., Jan. 1998, pp. 1–22, Appendix pp. A1–A4.

"Concurrent RDRAM User Guide," Rambus Inc., Nov. 1997, pp. 1–29.

(List continued on next page.)

*Primary Examiner*—Sumati Lefkowitz
(74) *Attorney, Agent, or Firm*—Skjerven Morrill MacPherson LLP

(57) ABSTRACT

An advanced input/output interface is provided for an integrated circuit memory having a memory storage array accessible by signals formatted in a two-level protocol. The advanced input/output interface includes a bit compression circuit for receiving a first plurality of signals formatted in the two-level protocol and generated within the integrated circuit memory. The bit compression circuit converts the first plurality of two-level protocol signals into a first signal formatted in a multi-level protocol. A bit decompression circuit receives a second signal formatted in the multi-level protocol. The bit decompression circuit converts the second multi-level protocol signal into a second plurality of signals formatted in the two-level protocol. In one embodiment, the advanced input/output interface allows for high speed/bandwidth memory accesses while reducing the pin count and operating frequency required for operation.

25 Claims, 10 Drawing Sheets

U.S. PATENT DOCUMENTS

| | | | | |
|---|---|---|---|---|
| 4,010,421 | * | 3/1977 | Lind | 375/293 |
| 4,123,710 | * | 10/1978 | Stuart et al. | 375/263 |
| 4,837,821 | * | 6/1989 | Kage | 380/9 |
| 5,166,956 | * | 11/1992 | Baltus et al. | 375/286 |
| 5,450,023 | * | 9/1995 | Yang et al. | 326/60 |
| 5,499,269 | * | 3/1996 | Yoshino | 375/257 |
| 5,684,833 | * | 11/1997 | Watanabe | 375/286 |
| 5,793,815 | * | 8/1998 | Goodnow et al. | 375/286 |
| 5,793,816 | * | 8/1998 | Hui | 375/286 |
| 5,898,886 | * | 4/1999 | Hewitt | 712/241 |
| 6,052,134 | * | 4/2000 | Foster | 345/521 |

OTHER PUBLICATIONS

"Rambus Memory Controller," Rambus Inc., Oct. 15, 1996, version 2.0, pp. 1–74.

Draft Standard for A High–Speed Memory Interface (Synclink), IEEE Standards Department, (unapproved draft), 1996, pp. 1–56.

"400 Mb/s/pin SLDRAM, 4M ×18 SLDRAM Pipelined, Eight Bank, 2.5V Operation," Draft/Advance, SLDRAM Consortium, Sep. 22, 1997, pp. 1–59.

"Main Memory Roadmap," Feb. 25, 1998 pp. SLDRAM.

"SLDRAM Architectural and Functional Overview," Peter Gillingham, MOSAID Technologies, Inc., SLDRAM Consortium, Aug. 29, 1997, pp. 1–14.

* cited by examiner

| $D_{k(1)}$ | $D_{k(0)}$ | $D_{k00}$ | $D_{k01}$ | $D_{k10}$ | $D_{k11}$ |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

$D_{k00} = \overline{D_{k(1)}}.\overline{D_{k(0)}}$ $D_{k01} = \overline{D_{k(1)}}.D_{k(0)}$ $D_{k10} = D_{k(1)}.\overline{D_{k(0)}}$ $D_{k11} = D_{k(1)}.D_{k(0)}$ $(K = 1, 2, ..., m)$

Truth Table for a 2-to-1 DDC

| DL1x | DL2x | DL3x | Dkx(0) | Dkx(1) |
|------|------|------|--------|--------|
| 0 | 0 | 0 | 0 | 0 |
| 1 | 0 | 0 | 1 | 0 |
| 1 | 1 | 0 | 0 | 1 |
| 1 | 1 | 1 | 1 | 1 |

$Dkx(1) = DL1x.DL2x$ $Dkx(0) = DL1x.\overline{DL2x}.DL3x + \overline{DL1x}.\overline{DL2x}.\overline{DL3x}$ (x=L,H)
(k=1,2,...,m)

*FIG. 9*

ADVANCED INPUT/OUTPUT INTERFACE FOR AN INTEGRATED CIRCUIT DEVICE USING TWO-LEVEL TO MULTI-LEVEL SIGNAL CONVERSION

TECHNICAL FIELD OF THE INVENTION

The present invention relates generally to the field of semiconductor integrated circuits, and more particularly, to an advanced input/output interface for integrated circuit device.

BACKGROUND OF THE INVENTION

Integrated circuit (IC) memory devices store large amounts of data in relatively small physical packages. Exemplary IC memory devices include dynamic random access memory (DRAM), static random access memory (SRAM), non-volatile random access memory (NVRAM), and read only memory (ROM), such as erasable programmable ROM (EPROM), electrically erasable programmable ROM (EEPROM), and flash memory.

Typically, an IC memory device comprises a plurality of cells into and from which data can be transferred for storage and retrieval. During such transfers, various signals are used to convey data and to control and coordinate the storage/retrieval of the same. These transfers can be made using industry-wide standard protocols, such as the PC100 bus standard initiated by Intel Corp. to support next generation PC systems.

Various input/output (I/O) interfaces have been previously developed to enable such transfers of data to and from the cells of an IC memory device. The following is a listing of various IC memory devices which incorporate previously developed I/O interfaces:

1. Fast Page Mode (FPM) DRAM is a single bank architecture which supports bursts of data (FPM access) from a memory storage array with transistor-to-transistor logic (TTL) interface technology. Parameters for this interface are as follows: $V_{IL}=0.8V$, $V_{IH}=2.4V$; $V_{OL}=0.8V$, $V_{OH}=2.4V$. The I/O interface is asynchronous.

2. Extended Data Out (EDO) DRAM extends single bank FPM architecture by adding a data validation window for faster timing with TTL or low-voltage TTL (LVTTL) interface technology. Parameters for LVTTL I/O interface are as follows: $V_{IL}=0.8V$, $V_{IH}=2.0V$; $V_{OL}=0.8V$, $V_{OH}=2.0V$. This interface is asynchronous.

3. Synchronous DRAM (SDRAM) is a multi-bank architecture with an added free-running clock for simplified circuit design using TTL or LVTTL interface technology. This architecture allows bank interleaving to minimize row-address strobe (RAS) access time latency. The I/O interface of SDRAM is synchronous.

4. Double Data Rate (DDR) SDRAM is an extension of SDRAM. In DDR SDRAM, data is transferred on both edges of a clock. A read strobe is provided for increased reliability. Control and address signaling is performed with LVTTL interface technology. Clock, data, and mask signaling is performed with stub series terminated logic (SSTL) interface technology. The parameters for SSTL technology are as follows: $V_{DD}=3 +/-0.3V$; $V_{REF}=1.3V$ to $1.7V$; $V_{IL}=V_{REF}-0.2V$, $V_{IH}=V_{REF}+0.2V$; $V_{OL}=V_{tt}-0.8V$, $V_{OH}=V_{tt}+0.8V$, $V_{tt}=V_{REF}+/-0.05V$. The maximum data rate is 250 Mbps/pin.

5. Direct Rambus™ DRAM (Direct RDRAM™) is similar to SDRAM, but replaces that architecture's I/O interface with a Rambus proprietary I/O interface technology. Direct RDRAM uses multiplexed row and column buses, and adds pipelined, packet-oriented transfer protocol I/O with Rambus Signaling Level (RSL) technology. The parameters for RSL technology are as follows: $V_{DD}=2.5V+/-5\%$; $V_{REF}=1.4+/-0.07V$; $V_{IL}=V_{REF}-0.5V$; $V_{IH}=V_{REF}+0.5V$; $V_{OL}=1.0V$; $V_{OH}=1.8V$. The data rate is approximately 600–800 Mbps/pin.

6. SyncLink™ DRAM (SLDRAM) utilizes pipelined, packet-oriented transfer protocol I/O with timing calibration (SyncLink proprietary) for increased DRAM bandwidth. The parameters for SLDRAM I/O (SLIO) interface technology as a follows: $V_{DD}=2.5V+/-5\%$; $V_{REF}=0.5 V_{DD}+/-0.05V$; $V_{IL}=V_{REF}-0.2V$, $V_{IH}=V_{REF}+0.2V$; $V_{OL}=0.9V$; $V_{OH}=1.6V$. The data rate is 400 Mbps/pin.

Each of the previously developed I/O interfaces listed above utilizes only two voltage levels for the information signals by which data is transferred to and from a memory device. Thus, with previous techniques, the only way to increase the transfer bandwidth of information (e.g., data or control) is to increase the speed or frequency at which a respective information signal is input or output. Because high frequency operation requires very dedicated small-signal handling and careful impedance match, the operational capability of previously developed I/O interfaces is limited.

As processors, controllers, and other devices which operate with IC memory are continuously improved, however, the rate at which data is desired increases. For example, central processing units (CPUS) operating at over 300 MHz and media processors executing more than two Giga Operations (GOPs) are now in production. Such processing devices require more than 500 Mbytes/s memory bandwidth. With the PC100 bus standard and state-of-the-art dynamic random access memory (DRAM) technology, DRAMs operating at 100 MHz are barely able to fulfill this bandwidth requirement. Furthermore, the projected memory bandwidth requirement for multimedia three-dimensional graphics applications exceeds 1 Gbytes/s. This transfer rate is well above what such IC memory devices can offer.

Furthermore, previously developed I/O interfaces require a separate pin connection for each signal used to transfer, or control the transfer of, information to and from an IC memory device. For example, each address signal, control signal, data signal, and the like, must be supported by its own pin connection in previously developed I/O interfaces. As the capacity and complexity of IC memory devices increases, the pin connections required to support signaling can become quite extensive. Numerous pin connections give rise to substantial electro-magnetic interference (EMI) on a PC board. Furthermore, a device with a large pin-count typically has a larger chip area and consumes more power.

SUMMARY OF THE INVENTION

The disadvantages and problems associated with previously developed interfaces for an integrated circuit memory have been substantially reduced or eliminated using the present invention.

According to the present invention, a small-voltage-swing, compression/decompression I/O interface can be incorporated on an IC memory device to achieve relatively high data bandwidth at a fraction of the clock frequency required by previously developed interface techniques. The I/O interface may include at least one bit compression circuit (BCC) and at least one bit decompression circuit (BDC) to compress and decompress data/address/control signal information at the input/output pins of the memory device. With the BCC and BDC, data and control information can be transferred to and received from a memory storage array of the memory device through a small-voltage swing, memory bus protocol. Such protocol is a multi-level protocol which uses more than two voltage levels for signaling, wherein each voltage level represents a predetermined set of values for at least two bits of information. A similar I/O interface may be incorporated into a control device for communication with the memory device. This allows information to be moved several times faster across a standard memory bus than with previously developed interfaces.

In accordance with one embodiment of the present invention, an advanced input/output interface is provided for an integrated circuit memory having a memory storage array accessible by signals formatted in a two-level protocol. The advanced input/output interface includes a bit compression circuit for receiving a first plurality of signals formatted in the two-level protocol and generated within the integrated circuit memory. The bit compression circuit converts the first plurality of two-level protocol signals into a first signal formatted in a multi-level protocol. The first multi-level protocol signal is communicated out of the integrated circuit memory. A bit decompression circuit receives a second signal formatted in the multi-level protocol. The bit decompression circuit converts the second multi-level protocol signal into a second plurality of signals formatted in the two-level protocol. The second plurality of two-level protocol signals are utilized within the integrated circuit memory. A similar I/O interface can be provided on a control device for communication with the integrated circuit memory.

In accordance with another embodiment of the present invention, a method is provided for interfacing with an integrated circuit memory having a memory storage array accessible by signals formatted in a two-level protocol. This method includes the following steps: converting a first plurality of signals formatted in the two-level protocol and generated within the integrated circuit memory into a first signal formatted in a multi-level protocol; communicating the first multi-level protocol signal out of the integrated circuit memory; receiving from outside the integrated circuit memory a second signal formatted in the multi-level protocol; and converting the second multi-level protocol signal into a second plurality of signals formatted in the two-level protocol, the second plurality of two-level protocol signals utilized within the integrated circuit memory.

An important technical advantage of the present invention includes allowing high-speed access to the memory cells of an integrated circuit (IC) memory device, such as DRAM, SRAM, NVRAM, and ROM. Another technical advantage of the present invention includes the ability to move information several times faster across a proprietary or industry-standard memory bus than with previously developed techniques. Yet another technical advantage of the present invention includes reducing the number of pins and the clock frequency which would otherwise be required to transfer information to and from an IC memory device. This minimizes the package pin-count, and hence, the EMI on a PC board, for high-bandwidth memory applications. Small pin-count and low operating frequency are extremely desirable for computer system applications where portability and power-consumption are primary concerns. Other important technical advantages of the present invention are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which:

FIG. 9 illustrates an exemplary truth table for the operation of the decompression decoder circuit.

DETAILED DESCRIPTION OF THE PREFERRED EMBODIMENTS

The preferred embodiments of the present invention and their advantages are best understood by referring to FIGS. 1 through 10B of the drawings. In these drawings, like numerals are used for like and corresponding parts.

Figure 1:
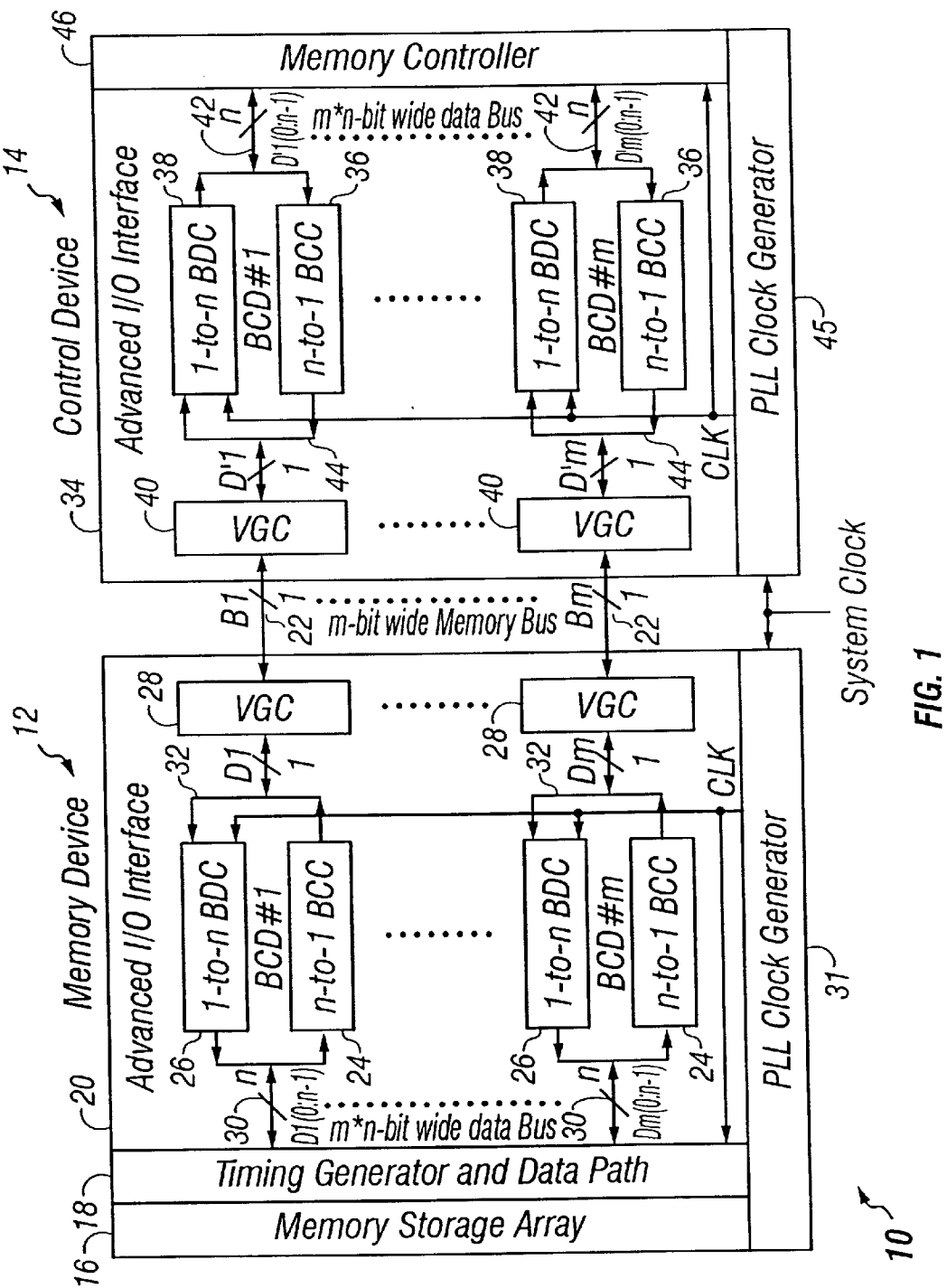
FIG. 1 illustrates an exemplary architecture comprising an integrated circuit memory device and a control device, both of which utilize an advanced input/output (I/O) interface, in accordance with an embodiment of the present invention.

FIG. 1 illustrates an exemplary architecture 10 comprising a memory device 12 and a control device 14, in accordance with an embodiment of the present invention. In general, memory device 12 can be any suitable integrated circuit (IC) memory device including dynamic random access memory (DRAM), static random access memory (SRAM), non-volatile random access memory (NVRAM), and read only memory (ROM), such as erasable programmable ROM (EPROM), electrically erasable programmable ROM (EEPROM), and flash memory, or any other suitable memory.

Memory device 12 includes a memory storage array 16. Memory storage array 16 comprises a plurality of memory cells (not shown), each of which functions to maintain data. In particular, separate bits of data may be written into, stored, and read out of each of these memory cells. The memory cells may be fabricated in any suitable technology, such as metal-oxide semiconductor (MOS) technology, according to techniques well-known and understood by those skilled in the art of IC memory. Further, these memory cells can be organized in any suitable structure, such as, for example, a matrix of rows and columns. A typical architecture connects all cells in a row to a common row line, often referred to as a "word line," and all cells in a column to a common column line, often referred to as a "bit line." Any suitable addressing scheme, such as row-column (i.e., X-Y coordinate) addressing or content-addressing, can be used to access the memory cells within storage array 16. Memory storage array 16 can be separated or divided into a plurality of memory blocks, wherein each block comprises one or more memory cells.

Timing generator and data path circuitry 18 is coupled to memory storage array 16. As used herein, the terms "coupled," "connected," or any variant thereof, means any coupling or connection, either direct or indirect, between two or more elements. Timing generator and data path circuitry 18 comprises one or more circuits which support the storage, maintenance, and/or access of information in memory storage array 16. For example, this circuitry may include a number of row address buffers, column address buffers, row decoders, column decoders, sense amplifiers, and the like for accessing the various memory cells in memory storage array 16. Furthermore, timing generator and data path circuitry 18 may include various clock generators, such as an output enable (OE) clock generator and a write enable (WE) clock generator, for enabling the reading and writing of data out of and into memory storage array 16.

Timing generator and data path circuitry 18 generates and/or routes numerous information signals which convey, or control or coordinate the conveyance of, data to and from memory storage array 16. These information signals include data signals for conveying data, addressing signals for identifying specific memory cells into and from which data is to be written or read, and control signals for coordinating or controlling the access, reading, and/or writing of the data. These information signals may be formatted in a two-level protocol which, at a given moment in time, only allows a single bit of information to be conveyed within a particular signal. That is, in the two-level protocol, a first voltage level represents a "1" or "high" value for a bit of information, and a second voltage level represents a "0" or "low" value for the bit of information.

An advanced input/output (I/O) interface 20 is coupled to timing generator and data path circuitry 18. Advanced I/O interface 20 provides high-speed access to memory storage array 16. In particular, advanced I/O interface 20 utilizes a multi-level, small-voltage-swing, interface protocol (described herein in more detail) to achieve very high data bandwidth at a fraction of the clock frequency required by previously developed techniques. This protocol can be communicated over an m-bit width, bi-directional memory bus 22, which can be an industry-standard memory bus (e.g., a PC100 bus) or a proprietary memory bus.

In general, advanced I/O interface 20 includes various circuitry for compressing and decompressing signal information (e.g., for data, address, control, and the like) at the input and output connection pins (not shown) for IC memory device 12. In a preferred embodiment, advanced I/O interface 20 includes at least one bit compression circuit (BCC) 24, at least one bit decompression circuit (BDC) 26, and at least one voltage gain control (VGC) circuit 28, which are generally connected to timing generator and data path circuitry 18 by at least one data bus 30. As shown in FIG. 1, m number of each of BCC 24, BDC 26, VGC circuit 28, and bus 30 are provided.

Each data bus 30 is bi-directional and has a bus-width of n. Accordingly, each bus 30 supports n signals to and from advanced I/O interface 20 and timing generator and data path circuitry 18. The value for n can be any suitable value which is consistent with the function and operation of an IC memory device, as described herein. Each of the n signals may convey data or control information. These signals are formatted in the two-level protocol described above, wherein information is encoded at only two levels—either a binary "1" or a binary "0." Thus, at a given moment, the waveform of each digital signal conveys only a single bit of information. Collectively, data buses 30 form an m*n-bit wide data bus.

A separate BCC 24 and BDC 26 is provided for each bus 30. Each BCC 24 receives the data and control signals from its respective bus 30. Generally, each BCC 24 functions to convert the n signals carried by the respective bus 30 into a single, multiplexed signal, which is then output on a respective bi-directional line 32. This is accomplished by compressing the two-level protocol signals, each conveying one bit of information at a given time, into a single, multiplexed signal formatted in a multi-level protocol. Such multi-level protocol conveys multiple bits of information at a given time by encoding information at more than two voltage levels. That is, the multi-level protocol uses three or more voltage levels for signaling, with each voltage level representing a predetermined set of values for at least two bits of information.

Each BCC 24 has a compression rate of n-to-1—i.e., compressing n two-level protocol signals from timing generator and data path circuitry 18 into a single, multi-level protocol signal. For this compression, the number of distinct signal levels needed in the multi-level protocol signal is $2^n$. For example, if two two-level protocol signals are fed into a BCC 24 (i.e., n=2), four (i.e., $2^2$) distinct signal levels should be available in the multi-level protocol signal. Since data and other information is compressed at a rate of n-to-1, advanced I/O interface 20 can transfer n times more data over a single line than previously developed interfaces operating at the same clock frequency. This reduces the amount of power consumed by memory device 12 during operation.

The multi-level protocol signal output by each BCC 24 can be a synchronous signal which is output at a double data rate (DDR)—i.e., clocked on both the rising and falling edges of a clock signal. In one embodiment, each BCC 24 will compress multi-bit information in one clock cycle on a per-pin basis.

Although FIG. 1 illustrates an embodiment in which all BCCs 24 have the same compression rate of n-to-1, it should be understood that in other embodiments, the BCCs 24 of an advanced I/O interface 20 can have different compression rates as appropriate or suitable for the operation of the IC memory device into which it is incorporated.

Each BDC 26 corresponds to a particular BCC 24 and is connected between the same bus 30 and line 32. Furthermore, each BDC 26 may receive a timing or clock signal from a phase locked loop (PLL) clock generator 31 (described below). Each BDC 26 functions to convert a multi-level protocol signal received over the respective line 32 into n two-level protocol signals, which are then output on the respective bus 30. More specifically, the received multi-level protocol signal can have any one of $2^n$ distinct signal levels representing a multiplex of n two-level protocol signals conveying input data, address, and control information from, for example, a host computer. BDC 26 decompresses the single, multiplexed signal at a 1-to-n decompression rate.

Since the computer information is transferred in a compressed format, the number of the connection pins and clock frequency can be reduced by a factor of n. This minimizes the package pin count for IC memory device 12. A small pin count and low operating frequency are extremely desirable for system applications where portability and power-consumption are primary concerns. Furthermore, the small pin count and low operating frequency substantially reduce problems related to electromagnetic interference (EMI) on a PC board for high bandwidth memory applications.

A separate VGC circuit 28 is coupled to each set of related BCCs 24 and BDCs 26. Each VGC circuit 28 operates on the multi-level protocol signals output by the respective BCC 24 and received by the respective BDC 26. Generally, each VGC circuit 28 provides gain for these multi-level protocol signals and also makes compensatory changes in gain based upon variations in the size of the signals. For a multi-level protocol signal output by the respective BCC 24, each VGC circuit 28 outputs a controlled signal which is placed on bus 22 connecting to control device 14. Each multi-level protocol signal input into a BDC 26 is generated by a respective VGC circuit 28 in response to a signal received over bus 22.

Each combination of BCC 24, BDC 26, and VGC circuit 28 may be associated with a particular portion of memory storage array 16 and timing generator and data path circuitry 18 for supporting signals specific to that portion. For example, memory storage array 16 can be divided into a plurality of blocks, each comprising an equal portion of the memory cells. A particular BCC/BDC/VGC circuit combination may operate upon all data signals for conveying data, addressing signals for identifying specific memory cells into and from which data is to be written or read, and control signals for coordinating or controlling the access, reading, and/or writing of the data for one of the memory blocks.

PLL clock generator 31 is coupled to timing generator and data path circuitry 18. PLL clock generator 31 receives a system clock signal as its input and generates a clock (CLK) signal for timing throughout advanced I/O interface 20. As described below, a number of other timing signals can be generated from the CLK signal output by PLL clock generator 31.

Control device 14 is connected to memory device 12 by memory bus 22. Control device 14 transfers data and other information to and from memory device 12 for control, addressing, processing, and other operations. Control device 14 can be an IC device, such as an application specific integrated circuit (ASIC), which can be incorporated into a host computer.

Control device 14 includes an advanced I/O interface 34, which is substantially similar to advanced I/O interface 20 of memory device 12. In particular, advanced I/O interface 34 of control device 14 includes at least one BCC 36, at least one bit BDC 38, at least one VGC circuit 40, at least one n-bit bus 42, at least one line 44, and a PLL clock generator 45 which can be substantially similar to BCC 24, BDC 26, VGC circuit 28, n-bit bus 30, line 32, and PLL clock generator 31, respectively. As shown in FIG. 1, m number of each of BCC 36, BDC 38, VGC circuit 40, and bus 42 are provided in advanced I/O interface 34 of control device 14.

A memory controller 46 is connected to advanced I/O interface 34. Memory controller 46 comprises circuitry, such as a microcontroller or a microprocessor, which can perform various operations upon, or in response to, data and other information. At least some of this information can be retrieved from or stored into the memory cells of memory device 12. Memory controller 46 can generate or receive a number of two-level protocol signals for conveying such information. Thus, for each of these information signals, only a single bit of information is conveyed within the signal at a given moment in time, wherein one voltage level represents a "1" or "high" value for the bit and another voltage level represents a "0" or "low" value for such bit.

In exemplary operation, advanced I/O interfaces 20 and 34 transfer computer information (e.g., data, address, and control information) between memory device 12 and control device 14. In particular, advanced I/O interfaces 20 and 34 serve to compress a plurality of two-level protocol signals into a single, respective multi-level protocol signal. The multi-level protocol uses more than two voltage levels for signaling, wherein each voltage level represents a predetermined set of values for at least two bits of information. This allows data to be moved between memory device 12 and control device 14 (across memory bus 22) several times faster than possible with previously developed interfaces. A multi-level protocol signal received from memory bus 22 at advanced I/O interface 20 or 34 is decompressed into a plurality of respective two-level protocol signals for use at memory device 12 or control device 14, respectively.

Figure 2:
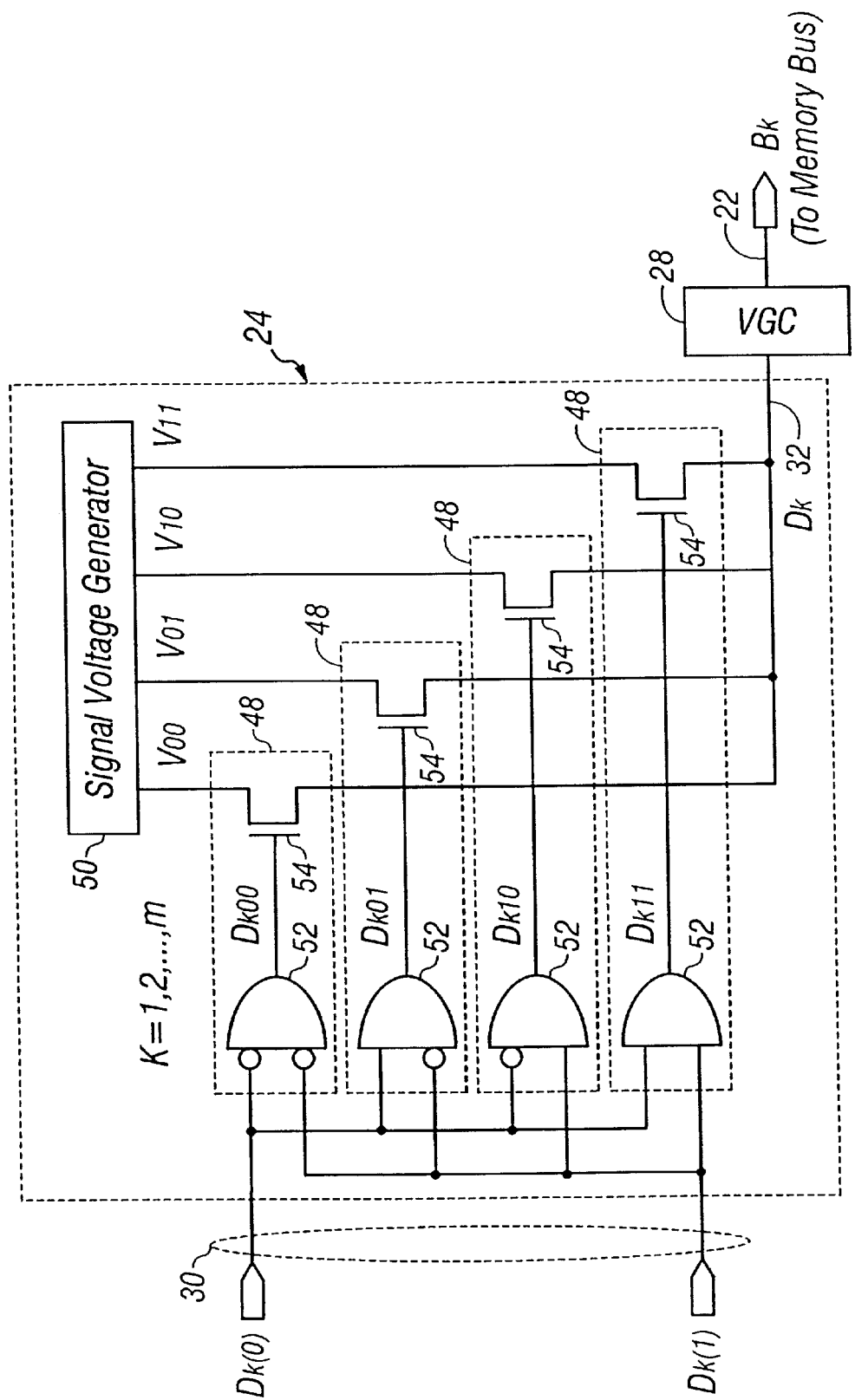
FIG. 2 is a schematic diagram of an exemplary embodiment for the bit compression circuit shown in FIG. 1.

FIG. 2 is a schematic diagram of an exemplary embodiment for a bit compression circuit (BCC) 24, such as that shown in FIG. 1. As previously described, BCC 24 generally functions to convert a plurality (i.e., n) of two-level protocol signals received over a respective bus 30 into a single, multi-level protocol signal which is output on a respective line 32. In FIG. 2, $D_{k(0)}$–$D_{k(n-1)}$ are the two-level protocol signals on bus 30. As shown, bus 30 supports two signals, $D_{k(0)}$ and $D_{k(1)}$. $D_k$ is the multi-level protocol signal on a respective line 32.

BCC 24 comprises a plurality of signal level generating circuits 48, each of which is coupled to bus 30, line 32, and a signal voltage generator 50. Generally, each signal level generating circuit 48, cooperating with signal voltage generator 50, functions to generate a different voltage level for the multi-level protocol in which signals output by BCC 24 are formatted. Thus, the number of signal level generating circuits 48 provided within BCC 24 corresponds to the number of distinct signal levels desired. As previously described, if n is the width of bus 30, and hence, the number of two-level protocol signals compressed by BCC 24, the number of distinct signal levels desired is $2^n$.

Figures 3, 4:
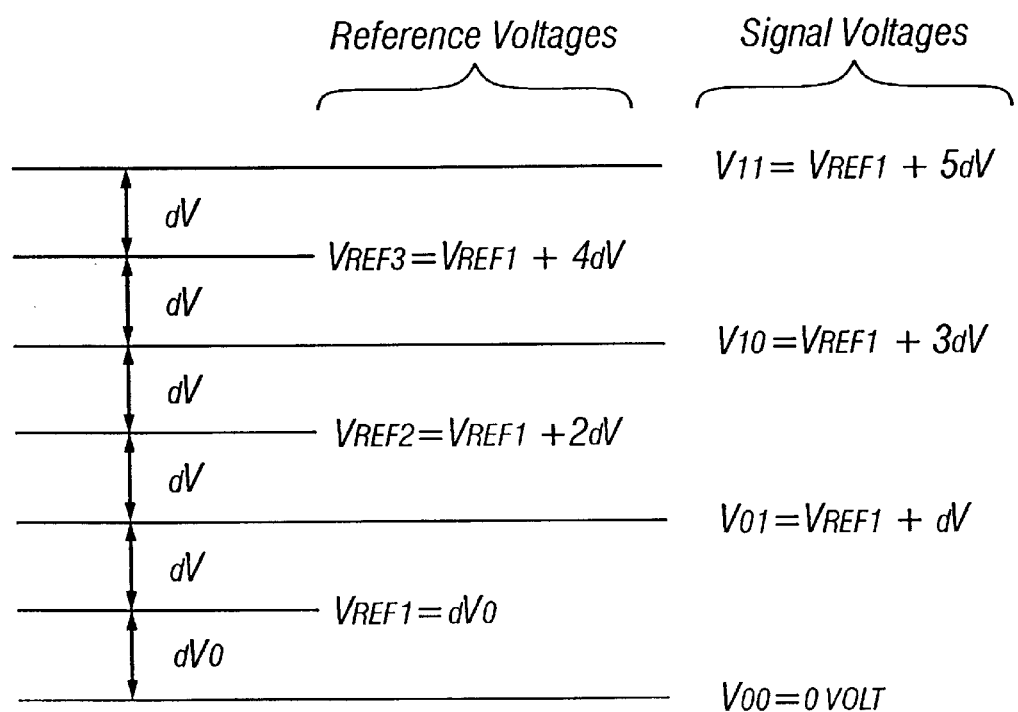
FIG. 3 illustrates an exemplary truth table for the operation of the bit compression circuit.
FIG. 4 illustrates a number of reference and signal voltages which can be used within the advanced input/output (I/O) interface.

Each signal level generating circuit 48 comprises an AND gate 52 having a separate input for each two-level protocol signal on bus 30. In some of signal level generating circuits 48, at least a portion of the two-level protocol signals may be inverted prior to input into the respective AND gate 52. Each signal level generating circuit 48 has a distinct arrangement for inverting the two-level protocol signals on bus 30 so that only one AND gate 52 outputs a "1" or "high" value for a given set of values in these signals (e.g., $D_{k(0)}$ and $D_{k(1)}$). For example, with regard to the specific embodiment shown in FIG. 2, one AND gate 52 outputs a high value when the values of both $D_{k(0)}$ and $D_{k(1)}$ are low; another AND gate 52 outputs a high value when $D_{k(0)}$ is low and $D_{k(1)}$ is high; yet another AND gate 52 outputs a high value when $D_{k(0)}$ is high and $D_{k(1)}$ is low; and the remaining AND gate 52 outputs a high value when the values of both $D_{k(0)}$ and $D_{k(1)}$ are high. The outputs of these AND gates 52 are $D_{k00}$, $D_{k01}$, $D_{k10}$, and $D_{k11}$, respectively. A truth table reflecting the operation of this portion of BCC 24 is shown in FIG. 3.

Referring again to FIG. 2, a separate n-type transistor 54 is connected at its gate to the output of each AND gate 52. The sources of these transistors 54 are connected to line 32. The drain of each transistor 54 is connected to signal voltage generator 50. Signal voltage generator 50 generates a number of different signal voltages, with a separate signal voltage for each distinct signal level in the multi-level protocol signal output by BCC 24. For example, if the maximum output voltage swing for BCC 24 is 1.5V, then one signal voltage can have value of 0V or ground, another signal voltage can have a value of 0.5V, yet another signal voltage can have a value of 1.0V, and the remaining signal voltage can have a value of 1.5V. These signal voltages are labeled $V_{00}$, $V_{01}$, $V_{10}$, and $V_{11}$, respectively. An exemplary relationship between these signal voltages $V_{00}$–$V_{11}$ is shown in FIG. 4. With further reference to FIG. 2, each transistor 54 acts as a switch to place the respective signal voltage value on line 32.

In operation, the two-level protocol signals on bus 30 are input into AND gate 52 of each signal level generating circuit 48. Because of the distinct arrangement for inverting signals prior to input into AND gates 52, only one of AND gates 52 outputs a high value in response to a particular set of values for the two-level protocol signals. This high value turns on the respective transistor 54, thereby causing that signal level generating circuit 48 to place a respective signal voltage level on line 32 as the multiplexed data signal $D_k$. A respective VGC 28 performs gain control on signal $D_k$ to output a signal $B_k$ on bus 22. The information in signal $B_k$ can be clocked out of advanced I/O interface 20 at DDR (i.e., clocked on both the rising and falling edges of a clock signal).

Figure 5:
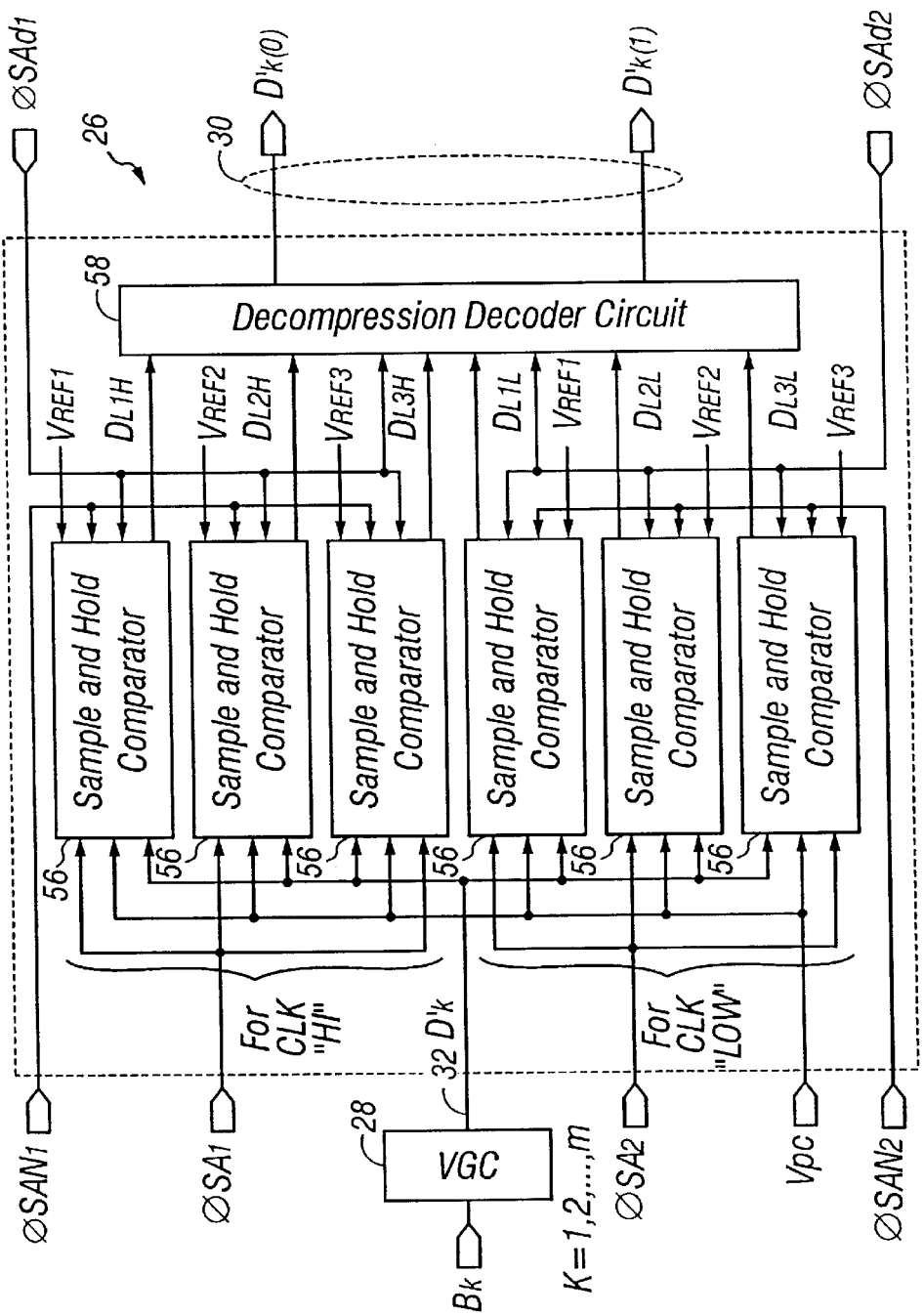
FIG. 5 is a block diagram of an exemplary embodiment for the bit decompression circuit shown in FIG. 1.

FIG. 5 is a block diagram of an exemplary embodiment for the bit decompression circuit (BDC) 26 shown in FIG. 1. BDC 26 functions to convert a single multiplexed signal ($D'_k$) formatted in a multi-level protocol and received over line 32 into a plurality of respective two-level protocol signals ($D'_{k(0)}$–$D'_{k(n-1)}$) which are then output on a respective bus 30. The multi-level protocol for signal $D'_k$ uses a number of levels of signal voltages, which can be the same as the signal voltages (e.g., $V_{00}$–$V_{11}$) available as output in a BCC 24. Each two-level protocol signal (e.g., $D'_{k(0)}$ and $D'_{k(1)}$) conveys one bit of information at a given time and can have a value of "1" or "0".

BDC 26 comprises a plurality of sample and hold comparators 56, each of which is coupled to line 32 to receive multiplexed signal $D'_k$. In one embodiment, as shown, where information in signal $D'_k$ is clocked at DDR, sample and hold comparators 56 may be divided into two groups: the first group operating on a "high" clock signal, and the second group operating on a "low" clock signal. Alternatively, in another embodiment, if a DDR technique is not utilized, only a single group of sample and hold comparators 56 may be provided.

Generally, each sample and hold comparator 56 functions to sample the multi-level protocol signal $D'_k$ and compare it against a specific reference voltage which, as shown, can be any of $V_{REF1}$, $V_{REF2}$, and $V_{REF3}$. An exemplary relationship between these reference voltages, and with signal voltages $V_{00}$–$V_{11}$, is shown in FIG. 4. In one embodiment, $V_{REF1}$, $V_{REF2}$, and $V_{REF3}$ can have values of 0.25V, 0.75V, and 1.25V, respectively. Referring again to FIG. 5, depending upon whether the sampled portion of the signal $D'_k$ is higher or lower than the respective reference voltage ($V_{REF1}$, $V_{REF2}$, or $V_{REF3}$), each sample and hold comparator 56 latches and outputs either a "1" or a "0" for a corresponding data latch signal $D_{L1H}$, $D_{L2H}$, $D_{L3H}$, $D_{L1L}$, $D_{L2L}$, or $D_{L3L}$. Signals $D_{L1H}$, $D_{L2H}$, and $D_{L3H}$ are output by the sample and hold comparators 56 operating on a high clock signal, while signals $D_{L1L}$, $D_{L2L}$, or $D_{L3L}$ are output by the sample and hold comparators 56 operating on a low clock signal.

Each sample and hold comparator 56 receives as an input a phase sense amplifier ($\phi$SA) signal, an inverted phase sense amplifier ($\phi$SAN) signal, and a "delayed" phase sense amplifier ($\phi$SAd) signal which are used to time the sampling and latching functions. As shown, a separate phase sense amplifier signal ($\phi$SA$_1$ or $\phi$SA$_2$), inverted phase sense amplifier ($\phi$SAN$_1$ or $\phi$SAN$_2$) signal, and "delayed" phase sense amplifier ($\phi$SAd$_1$ or $\phi$SAd$_2$) signal are provided for each group of sample and hold comparators 56. $\phi$SA$_1$, $\phi$SAN$_1$, $\phi$SAd$_1$ clock the sample and hold comparators 56 operating on a high clock signal; $\phi$SA$_2$, $\phi$SAN$_2$, and $\phi$SAd$_2$ clock the sample and hold comparators 56 operating on a low clock signal. Each sample and hold comparator 56 may also be coupled to Vcc and another voltage source Vpc, which may have a value of one-half of Vdd.

A decompression decoder circuit 58, coupled to each of sample and hold comparators 56, receives the data latch signals $D_{L1H}$, $D_{L2H}$, $D_{L3H}$, $D_{L1L}$, $D_{L2L}$, and $D_{L3L}$. Decompression decoder circuit 58 generally functions to decode or otherwise process these data latch signals in order to assign appropriate values (i.e., "0" or "1") to the bits of information conveyed with the two-level protocol signals (e.g., $D'_{k(0)}$ and $D'_{k(1)}$) output by BDC 26. Decompression decoder circuit 58 receives one or both of $\phi$SAd$_1$ or $\phi$SAd$_2$ signals.

Figure 6:
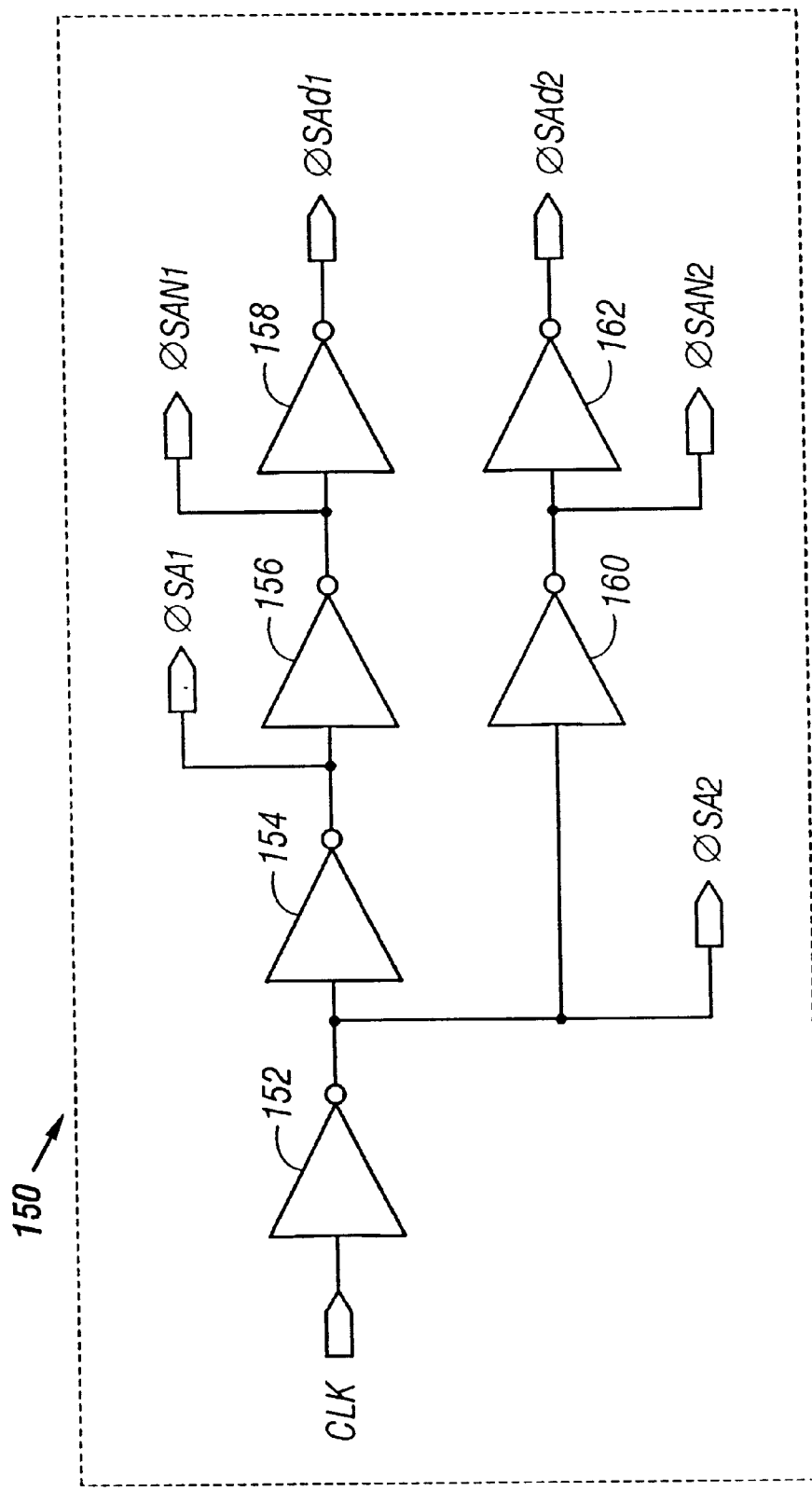
FIG. 6 is a schematic diagram of an exemplary embodiment for a timing generator circuit for the bit decompression circuit shown in FIG. 1.

FIG. 6 is a schematic diagram of an exemplary embodiment for a timing generator circuit 150 for the BDC circuit 26 shown in FIG. 1. Timing generator circuit 150 functions to generate the various signals which are used for timing in BDC circuit 26. In particular, timing generator circuit 150 operates on the CLK signal (FIG. 1) to produce signals $\phi$SA$_1$, $\phi$SAN$_1$, $\phi$SAd$_1$, $\phi$SA$_2$, $\phi$SAN$_2$ or $\phi$SAd$_2$. Of these signals, $\phi$SA$_1$, $\phi$SAN$_1$, $\phi$SAd$_i$ are preferably used for one set of related circuits associated with a "high" clock signal, and $\phi$SA$_2$, $\phi$SAN$_2$ or $\phi$SAd$_2$ are preferably used for another set of related circuits associated with a "low" clock signal.

As shown, timing generator circuit 150 includes a number of inverters 152, 154, 156, 158, 160, and 162. Inverter 152 receives and inverts the CLK signal to generate the $\phi$SA$_2$ signal. Inverters 154 and 160 each receives and operates upon the output of inverter 152 to generate the $\phi$SA$_1$ and $\phi$SAN$_2$ signals, respectively. Inverter 156 is coupled to the output of inverter 154 and generates the $\phi$SAN$_1$ signal. Inverter 158 receives and operates upon the output of inverter 156 to generate the $\phi$SAd$_1$ signal. Inverter 162 is coupled to the output of inverter 160 and generates the $\phi$SAd$_2$ signal.

Figure 7:
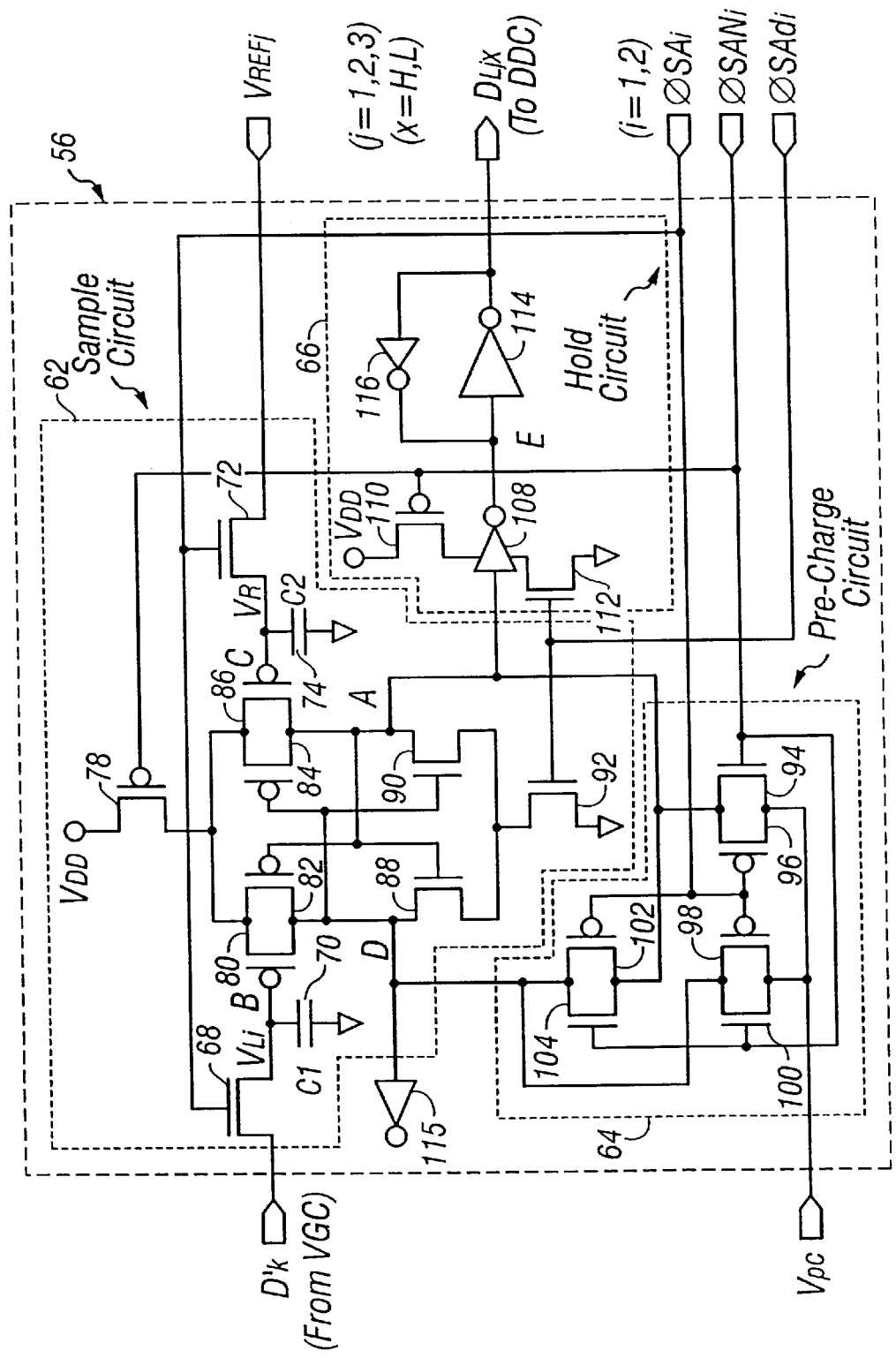
FIG. 7 is a schematic diagram of an exemplary embodiment for the sample and hold comparator shown in FIG. 5.

FIG. 7 is a schematic diagram of an exemplary embodiment for the sample and hold comparator 56 shown in FIG. 5. Sample and hold comparator 56 generally includes a sample circuit 62, a pre-charge circuit 64, and a hold circuit 66.

Sample circuit 62 generally functions to sample the signal voltage level of $D'_k$ and to compare the sampled voltage against a particular reference voltage $V_{REFj}$ (e.g., $V_{REF1}$, $V_{REF2}$, or $V_{REF3}$). If the signal voltage level is higher than the respective reference voltage, sample circuit 62 outputs a "1" at a node A. Otherwise, if the signal voltage level of $D'_k$ is lower than the reference voltage, sample circuit 62 outputs a "0" at node A.

As shown, sample circuit 62 includes an n-type transistor 68 which acts as a passgate for signal $D'_k$. When the respective phase sense amplifier signal ($\phi$SA$_1$ or $\phi$SA$_2$) for sample and hold comparator 56 is high, signal $D'_k$ is passed to a node B, where the signal's voltage value is stored as a latched voltage "$V_{Li}$" into a capacitor 70. An n-type transistor 72 and a capacitor 74 operate in a similar manner to pass and store the respective reference voltage as "$V_R$" at a node C.

A p-type transistor 78 receives the $\phi$SAN$_i$ signal at its gate and is coupled to Vdd at its source. The drain of transistor 78 is coupled to the sources of p-type transistors 80, 82, 84, and 86. The drains of transistors 80 and 82 are coupled together at a node D. The gate of transistor 80 is connected to node B, and the gate of transistor 82 is connected to node A. The drains of transistors 84 and 86 are connected together at node A. The gate of transistor 84 is connected to node D, and the gate of transistor 86 is connected to node C. The drain and gate of an n-type transistor 88 are connected to nodes D and A, respectively, while the drain and gate of an n-type transistor 90 are connected to nodes A and D, respectively. With this arrangement, transistors 82, 84, 88, and 90 may function as a high-gain sense amplifier to amplify any difference in voltage between nodes A and D. The sources of transistors 88 and 90 are connected to the drain of an n-type transistor 92. Transistor 92 is connected to ground at its source and receives the $\phi SAd_i$ signal at its gate.

Pre-charge circuit 64 generally functions to pre-charge nodes A and D to a level of approximately one-half Vcc when the respective phase sense amplifier signal ($\phi SA_1$ or $\phi SA_2$) is low. Pre-charge circuit 64 includes an n-type transistor 94 and a p-type transistor 96, which are connected together between node A and voltage source Vpc. Similarly, a p-type transistor 98 and an n-type transistor 100 are connected together between node D and Vpc. A p-type transistor 102 and an n-type transistor 104 are connected together between nodes D and A. The gates of transistors 96, 98, and 102 each receive the $\phi SA_i$ signal. The gates of transistors 94, 100, and 104 each receive the $\phi SAN_i$ signal.

Hold circuit 66 functions to hold the value of the signal output by sample circuit 62 at node A. Hold circuit 66 comprises an inverter 108 coupled to node A. Inverter 108 functions as a level shifter which generates an output at a node E. A p-type transistor 110 has its drain connected to inverter 108, its source coupled to Vcc, and its gate receiving the $\phi SAN_i$ signal. An n-type transistor 112 has its drain connected to inverter 108, its source coupled to ground, and its gate receiving the $\phi SAd_i$ signal. Transistors 110 and 112 function as a virtual power supply control gates. An inverter 114 receives the output of inverter 108 at node E. Preferably, the current driving strength of inverter 116 is much weaker than that of inverter 108. The output of inverter 114 is also the output for sample and hold comparator 56 (i.e., data latch signal $D_{LjL}$ or $D_{LjH}$). An inverter 116 receives the output of inverter 114 and its output appears at node E. As such, inverters 114 and 116 function as a latch. Inverter 108 functions as a buffer between the cross-coupled latch (formed by inverters 114 and 116) and node A, especially when sample and hold comparator 56 is run at a very high frequency that does not allow a full rail-to-rail signal level at node A. Inverter 108 also blocks the current path from inverter 114 to node A to avoid potential disturbance to node A, thereby allowing sample circuit 62 to operate at very high frequency.

In operation, when the clock (CLK) signal is high, the $\phi SA_i$ signal is also high, thereby turning on pass gate transistors 68 and 72. This allows the voltages values for $D'_k$ and $V_{REFj}$ to be latched into nodes B and C respectively. Because the $\phi SA_i$ signal is high, transistors 96, 98, and 102 in pre-charge circuit 64 are turned off. Furthermore, when the $\phi SA_i$ signal is high, the $\phi SAN_i$ signal is low, thereby turning off transistors 94, 100, and 104 in pre-charge circuit 64. Because all of the transistors in pre-charge circuit 64 are off, the pre-charge reference voltage Vpc is disconnected from nodes A and D.

Since $\phi SAN_i$ is low, transistor 78 in sample circuit 62 is turned on. Accordingly, differential voltages of Vpc(+/−) 75–125 mV at nodes A and D are established through transistors 80 and 86, due to the voltage difference between $V_{Li}$ and $V_R$ at nodes B and C, respectively. More specifically, if $V_{Li}$ is higher than $V_R$, then the voltage at node D will be lower than that at node A by approximately 150–250 mV. If $V_{Li}$ is lower than $V_R$, then the voltage at node D will be higher than that at node A by approximately 150–250 mV.

After the differential voltage is established between nodes A and D, which requires one inverter delay after the $\phi SAN_i$ signal goes low, the $\phi SAd_i$ signal goes high, thereby turning on transistor 92 in sample circuit 62. This enables the high-gain sense amplifier formed from transistors 82, 84, 88, and 90 to amplify the differential voltage signal established between nodes A and D. Since the voltages at nodes A and D are approximately one-half Vdd(+/−)75–125 mV before amplification, when transistor 92 turns on, the intermediate voltages at nodes A and D are immediately amplified to almost a full rail-to-rail level.

When the $\phi SAd_i$ signal goes high, it also turns on transistor 112 in hold circuit 66, thereby enabling level shifting inverter 108. At this moment, the amplified data at node A will be passed through level shifting inverter 108 and held at node E by cross-coupled latch inverters 114 and 116 for one clock cycle. Inverter 114 latches the recovered data at node E after control gate transistors 110 and 112 are turned off.

When the CLK signal goes low, the $\phi SA_i$ signal also goes low and the $\phi SAN_i$ signal goes high. This turns on transistors 94–104 in pre-charge circuit 64, thereby pre-charging nodes A and D to about one-half Vcc using Vpc. This pre-charging of nodes A and D supports the high-speed operation of sample circuit 62 because differential amplifier of sample circuit 62 is biased into a very high gain mode. Furthermore, the rail-to-rail voltage transition at nodes A and D is made more rapid. At this moment, sample circuit 62 is disabled and hold circuit 66 retains the incoming data at node E so that this data will be available for access by an appropriate element or device, such as, for example, a memory controller.

In summary of the operation, when $\phi SA_i$ is high, the incoming data $D'_k$ is stored at node B, sampled by the differential amplifier formed of transistors 82, 84, 88, and 90 of sample circuit 62, and latched into hold circuit 64. During the time when $\phi SA_i$ is low, the incoming data $D'_k$ will be held at node B for one-half of a clock cycle to ensure that the $D'_k$ data can be compared and amplified before the $\phi SA_i$ signal goes back high again to sample the next data.

With the operation described above, sample and hold comparator 56 can be operated at a frequency higher than 250 MHz when implemented with 0.35 micron complementary metal-oxide semiconductor (CMOS) technology. Furthermore, if deep sub-micron (e.g., 1.8–2.5 micron) CMOS technology is used, operation at higher than 500 MHz can be achieved. For the DDR transfer format described herein, 2 Gbits/second per data channel is attainable. If a 64-bit data bus is used, this translates into a 16 Gbytes/s data transfer rate.

Figure 8:
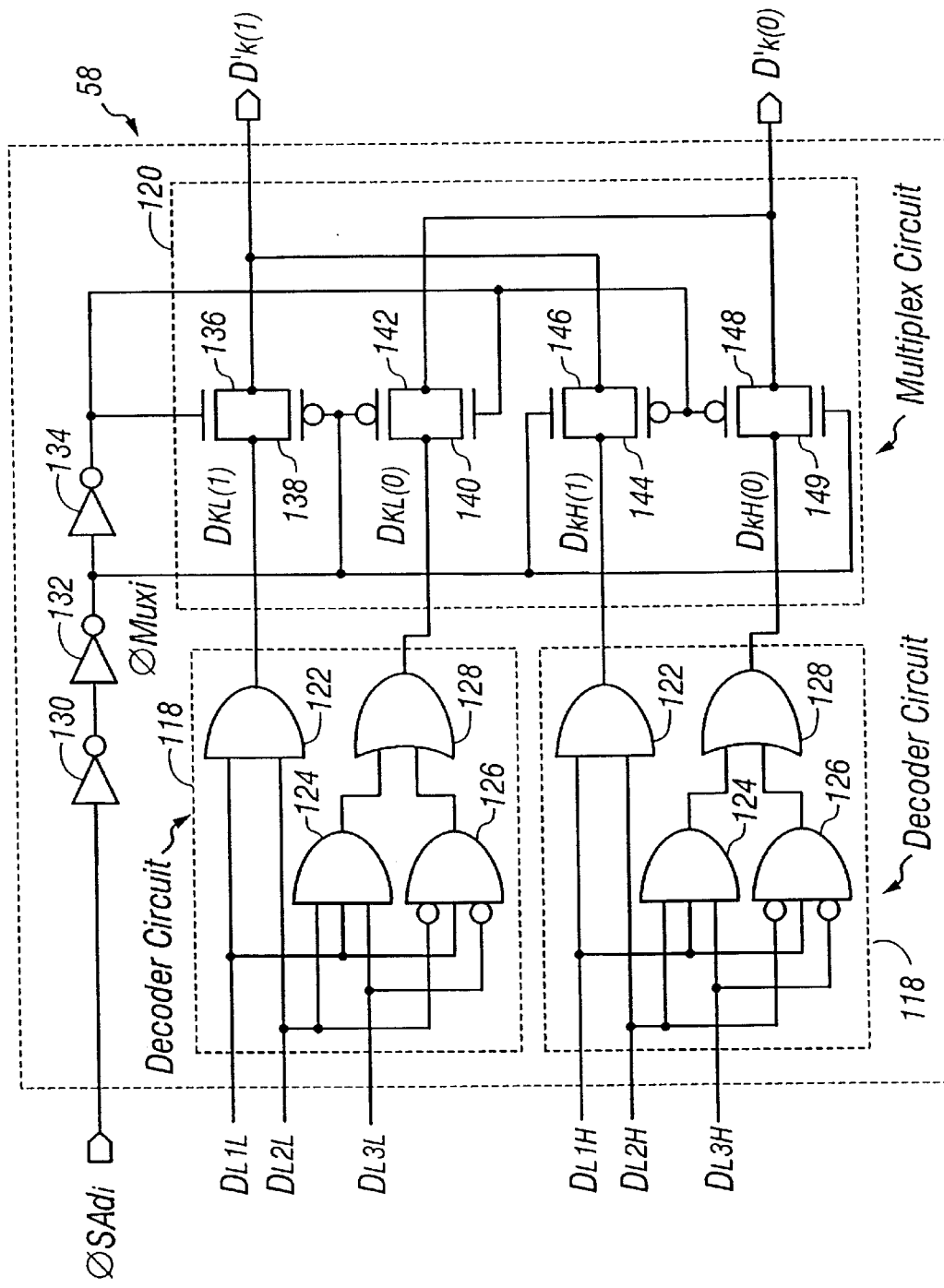
FIG. 8 is a schematic diagram of an exemplary embodiment for the decompression decoder circuit shown in FIG. 5.

FIG. 8 is a schematic diagram of an exemplary embodiment for the decompression decoder circuit 58 shown in FIG. 5. Decompression decoder circuit 58 receives the data latch signals $D_{L1H}$, $D_{L2H}$, $D_{L3H}$, $D_{L1L}$, $D_{L2L}$, and $D_{L3L}$ and decodes these signals to assign appropriate binary values to the bits of information conveyed with the two-level protocol signals $D'_{k(0)}$ and $D'_{k(1)}$. In one embodiment, decompression decoder circuit 58 comprises at least one decoder circuit 118 and a multiplex circuit 120.

As shown, two decoder circuits 118 are provided. Each decoder circuit 118 operates on one set of data latch signals output by the respective sample and hold comparators 56 (FIG. 5). Specifically, one decoder circuit 118 decodes data latch signals $D_{L1L}$, $D_{L2L}$, and $D_{L3L}$ (timed on a low clock signal) to output data signals $D_{kL(1)}$ and $D_{kL(0)}$. The other decoder circuit 118 decodes data latch signals $D_{L1H}$, $D_{L2H}$, and $D_{L3H}$ (timed on a high clock signal) to output data signals $D_{kH(1)}$ and $D_{kH(0)}$. A truth table illustrating the decoding operation performed by each decoder circuit 118 is shown in FIG. 9. With this operation, each decoder circuit 118 determines a value ("1" or "0") for the bits conveyed in two-level protocol signals $D'_{k(1)}$ and $D'_{k(0)}$.

Each decoder circuit 118 can be implemented as combination of logic gates. As shown, such a combination includes a number of AND gates 122, 124, and 126, and an OR gate 128. AND gate 122 receives as inputs $D_{L1L}$ and $D_{L2L}$ (or $D_{L1H}$ and $D_{L2H}$) and outputs $D_{kL(1)}$ (or $D_{kH(1)}$). AND gate 124 receives each of $D_{L1L}$, $D_{L2L}$, and $D_{L3L}$ (or $D_{L1H}$, $D_{L2H}$, and $D_{L3H}$) as inputs. AND gate 126 receives as inputs $D_{L1L}$ and the complements of $D_{L2L}$ and $D_{L3L}$ (or $D_{L1H}$ and the complements of $D_{L2H}$ and $D_{L3H}$). OR gate 128 receives the outputs of AND gates 124 and 126 and, in response, outputs $D_{kL(0)}$ (or $D_{kH(0)}$).

Multiplex circuit 120 is coupled to and receives the output data signals ($D_{kL(1)}$, $D_{kL(0)}$, $D_{kH(1)}$ and $D_{kH(0)}$) from decoder circuits 118. Multiplex circuit 120 multiplexes these data signals to pass either the values of $D_{kL(1)}$ and $D_{kL(0)}$, or alternatively, the values of $D_{kH(1)}$ and $D_{kH(0)}$, as the outputs $D'_{k(1)}$ and $D'_{k(0)}$ of the respective BDC 26. Multiplex circuit 120 is timed with clock signals, including a $\phi Mux_i$ signal, which are generated from the $\phi SAd_i$ signal by sequentially coupled inverters 130, 132, and 134.

Multiplex circuit 120 includes an n-type transistor 136 and a p-type transistor 138 coupled between the output of AND gate 122 of one decoder circuit 118 and the $D'_{k(1)}$ output of decompression decoder circuit 58. An n-type transistor 140 and a p-type transistor 142 are coupled between the output of OR gate 128 of the same decoder circuit 118 and the $D'_{k(0)}$ output. Transistors 138 and 142 receive the $\phi Mux_i$ signal at their gates, and transistors 136 and 140 receive the complement of the $\phi Mux_i$ signal at their gates. Upon the occurrence of a "low" value for the $\phi Mux_i$ signal, transistors 136, 138, 140, and 142 pass the values $D_{kL(1)}$ and $D_{kL(0)}$ as the outputs $D'_{k(1)}$ and $D'_{k(0)}$, respectively.

A p-type transistor 144 and an n-type transistor 146 are coupled between the output of AND gate 122 for the other decoder circuit 118 and the $D'_{k(1)}$ output of decompression decoder circuit 58. A p-type transistor 148 and an n-type transistor 149 are coupled between the output of OR gate 128 of the same decoder circuit 118 and the $D'_{k(0)}$ output. The gates of transistors 146 and 149 receive the $\phi Mux_i$ signal, and the gates of transistors 144 and 148 receive the complement of the $\phi Mux_i$ signal. Upon the occurrence of a "high" value for the $\phi Mux_i$ signal, transistors 144, 146, 148, and 149 pass the values $D_{kH(1)}$ and $D_{kH(0)}$ as the outputs $D'_{k(1)}$ and $D'_{k(0)}$, respectively.

It should be understood that a multiplex circuit 120 is not necessary if only a single decoder circuit 118 is provided, such as would be the case if a DDR technique is not used. For example, it may be preferable that the memory controller directly access $D_{kL(0)}$, $D_{kL(1)}$, $D_{kH(0)}$, and $D_{kH(1)}$ in a non-DDR data format.

Figure 10A:
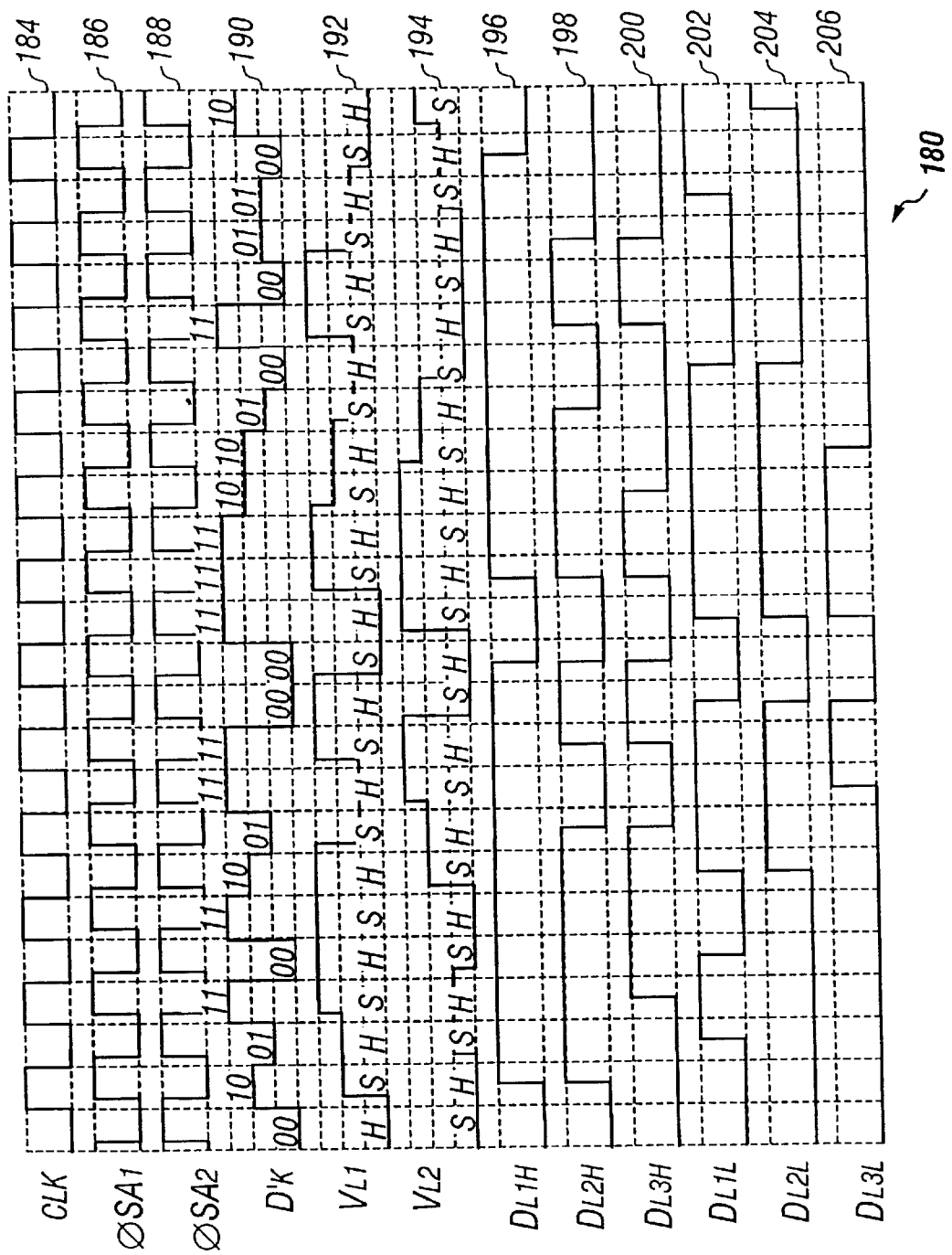
FIGS. 10A and 10B are exemplary timing diagrams for a memory device having an advanced I/O interface, in accordance with an embodiment of the present invention.
Figure 10B:
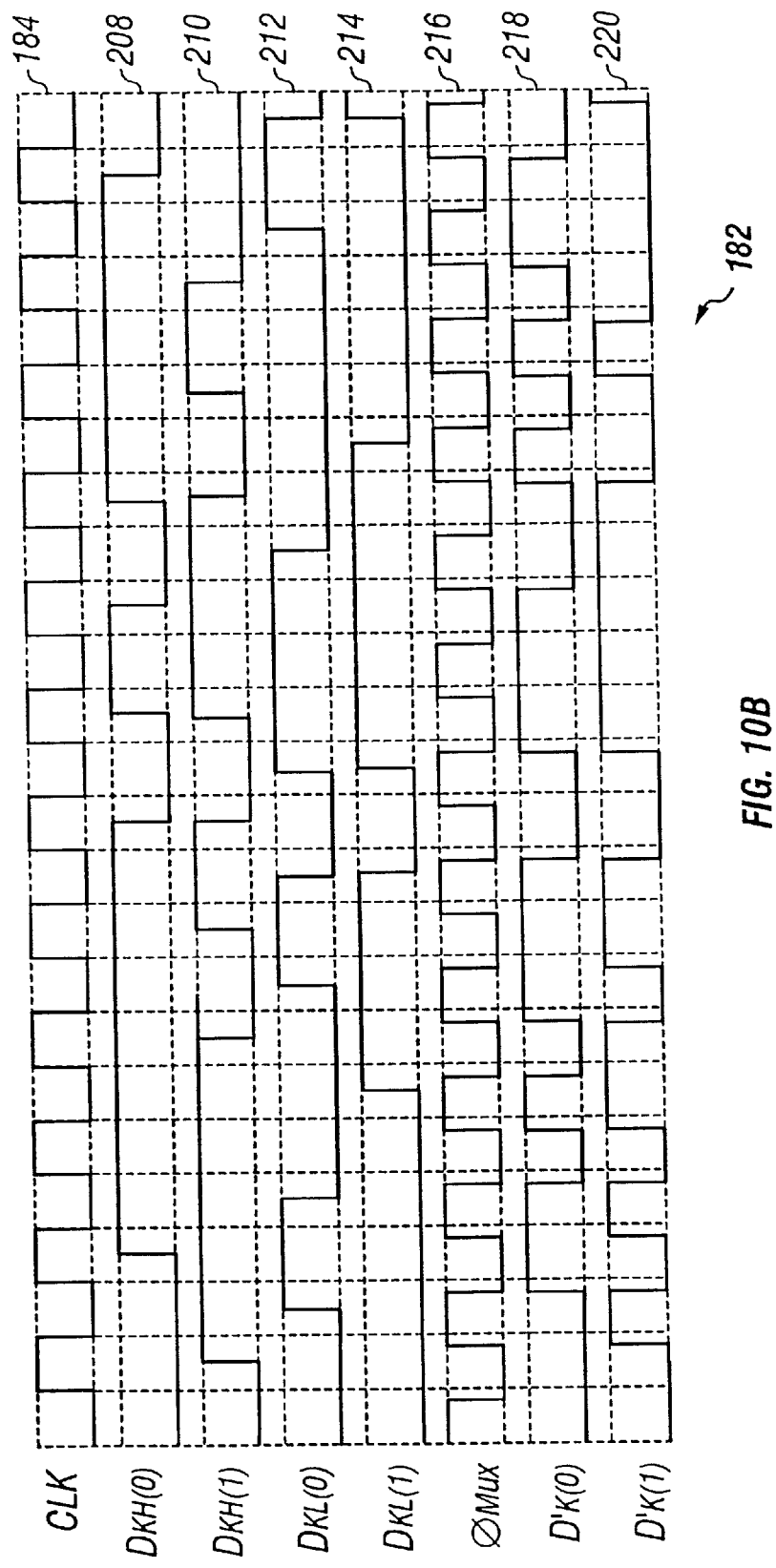

FIGS. 10A and 10B are exemplary timing diagrams 180 and 182, respectively, for a memory device having an advanced I/O interface, in accordance with an embodiment of the present invention. Timing diagrams 180 and 182 include a plurality of exemplary waveforms that may be input or generated for various signals appearing in the advanced I/O interface described herein.

A clock (CLK) signal 184 may be generated in PLL clock generator 31 of memory device 12 (FIG. 1). A first phase sense amplifier ($\phi SA_1$) signal 186 and a second phase sense amplifier ($\phi SA_2$) signal 188, derived from CLK signal 184, are generated in timing generator circuit 150 (FIG. 6). CLK signal 184, $\phi SA_1$ signal 186, and $\phi SA_2$ signal 188 are used for timing throughout the advanced I/O interface. Each of these signals comprises a number of clock pulses, wherein each pulse has a leading edge and a falling edge. In one embodiment, clocking can be performed at a double data rate (DDR)—i.e., clocking occurs at both the leading edge and falling edge of each clock pulse.

A data ($D'_k$) signal 190 may be received at a BDC 26 (FIG. 5). $D'_k$ signal 190 is formatted in a multi-level protocol. That is, this signal comprises a number of pulses. Each pulse may have one of four voltage levels, each of which corresponds to a particular set of values for two bits of data. Specifically, a first voltage level, with the lowest voltage value, corresponds to the case where both bits have low values ("00"). A second level, with a slightly higher voltage value, corresponds to the case where the first bit has a low value and the second bit has a high value ("01"). A third level, with a higher voltage value than either the first or second levels, corresponds to the case where the first bit has a high value and the second bit has a low value ("10"). A fourth level, with the highest voltage value, corresponds to the case where both bits have high values ("11").

A first voltage latched ($V_{L1}$) signal 192 and a second voltage latched ($V_{L2}$) signal 194 can be generated in a sample and hold comparator 56 (FIG. 7), for example, by sampling $D'_k$ signal 190 using $\phi SA_1$ signal 186 and $\phi SA_2$ signal 188, respectively. A plurality of data latched "high" ($D_{L1H}$, $D_{L2H}$, and $D_{L3H}$) signals 196, 198, and 200 can be generated by a plurality of sample and hold comparators 56 by comparing $V_{L1}$ signal 192 against a respective reference voltage ($V_{REF1}$, $V_{REF2}$, and $V_{REF3}$). Similarly, a plurality of data latched "low" ($D_{L1L}$, $D_{L2L}$, and $D_{L3L}$) signals 202, 204, and 206 can be generated by a plurality of sample and hold comparators 56 by comparing $VL_2$ signal 194 against a respective reference voltage ($V_{REF1}$, $V_{REF2}$, and $V_{REF3}$) A data bit-zero "high" ($D_{kH(0)}$) signal 208 and a data bit-one "high" ($D_{kH(1)}$) signal 210 may be generated in a decompression decoder circuit 58 by decoding $D_{L1H}$, $D_{L2H}$, and $D_{L3H}$ signals 196, 198, and 200. Likewise, a data bit-zero "low" ($D_{kL(0)}$) signal 212 and a data bit-one "low" ($D_{kL(1)}$) signal 214 may be generated in the decompression decoder circuit 58 by decoding $D_{L1L}$, $D_{L2L}$, and $D_{L3L}$ signals 202, 204, and 206.

A phase multiplex ($\phi Mux_i$) signal 216 may be generated in the decompression decoder circuit 58. A recovered data bit-zero ($D'_{k(0)}$) signal 218 and a recovered data bit-one ($D'_{k(1)}$) signal 220 are generated by sampling $D_{kH(0)}$, $D_{kH(1)}$ signals 208 and 210 on each "high" clock of $\phi Mux_i$ signal 216 and by sampling $D_{kL(0)}$, $D_{kLH(1)}$ signals 212 and 21 on each "low" clock of $\phi Mux_i$ signal 216. $D'_{k(0)}$ signal 218 $D'_{k(1)}$ signal 220 are formatted in a two-level protocol.

Although the present invention and its advantages have been described in detail, it should be understood that various changes, substitutions, and alterations can be made therein without departing from the spirit and scope of the invention as defined by the appended claims.

What is claimed is:

1. An advanced input/output interface for an integrated circuit memory having a memory storage array accessible by signals formatted in a two-level protocol, the advanced input/output interface comprising:
   a bit compression circuit for receiving a clock signal and a first plurality of signals formatted in the two-level protocol and generated within the integrated circuit memory, the bit compression circuit for converting the first plurality of two-level protocol signals into a first signal formatted in a multi-level protocol, the first multi-level protocol signal communicated out of the integrated circuit memory in synchronization with the clock signal; and
   a bit decompression circuit for receiving a second signal in synchronization with the clock signal, the second signal formatted in the multi-level protocol, the bit decompression circuit for converting the second multi-level protocol signal into a second plurality of signals formatted in the two-level protocol, the second plurality of two-level protocol signals utilized within the integrated circuit memory, wherein the bit decompression circuit comprises a sample and hold comparator for sampling a voltage of the second multi-level protocol signal and holding the sampled voltage for comparison against a reference voltage.

2. The advanced input/output interface of claim 1, comprising an automatic voltage gain control circuit coupled to the bit compression circuit and the bit decompression circuit, the voltage gain control circuit for controlling gain on the first multi-level protocol signal.

3. The advanced input/output interface of claim 1, wherein the bit compression circuit comprises a signal voltage generator for generating a plurality of signal voltages, each signal voltage corresponding to a respective level in the multi-level protocol.

4. The advanced input/output interface of claim 1, wherein the bit compression circuit comprises a plurality of signal level generating circuits, each signal level generating circuit for outputting a different voltage level on the first multi-level protocol signal.

5. The advanced input/output interface of claim 1, wherein the sample and hold comparator outputs a data latch signal.

6. The advanced input/output interface of claim 1, wherein the sample and hold comparator comprises:
   a sample circuit for sampling a voltage of the second multi-level protocol signal, comparing the sampled voltage against a reference voltage, and outputting a resultant voltage in response to the comparison; and
   a hold circuit for holding a value for the resultant voltage.

7. The advanced input/output interface of claim 6, wherein the sample circuit comprises a sense amplifier.

8. The advanced input/output interface of claim 6, comprising a pre-charge circuit for pre-charging at least one node in the sample circuit.

9. The advanced input/output interface of claim 1, wherein each of the bit compression circuit and the bit decompression circuit utilizes a double data rate technique.

10. An integrated circuit memory comprising:
    a memory storage array controlled and accessible by signals formatted in a two-level protocol;
    a clock generator coupled to the memory storage array, the clock generator operable to generate a clock signal; and
    an advanced input/output interface coupled to the memory storage array, the advanced input/output interface comprising:
       a bit compression circuit for receiving the clock signal and a first plurality of signals formatted in the two-level protocol and generated within the integrated circuit memory, the bit compression circuit for converting the first plurality of two-level protocol signals into a first signal formatted in a multi-level protocol, the first multi-level protocol signal communicated out of the integrated circuit memory in synchronization with the clock signal;
       a bit decompression circuit for receiving a second signal in synchronization with the clock signal, the second signal formatted in the multi-level protocol, the bit decompression circuit for converting the second multi-level protocol signal into a second plurality of signals formatted in the two-level protocol, the second plurality of two-level protocol signals utilized within the integrated circuit memory, the bit decompression circuit comprising:
          a plurality of sample and hold comparators, each sample and hold comparator for sampling a voltage of the second multi-level protocol signal and comparing the sampled voltage against a respective reference voltage to output a respective data latch signal; and
          a decompression decoder circuit coupled to the sample and hold comparators, the decompression decoder circuit for decoding the data latch signals to output the second plurality of two-level protocol signals; and
       a voltage gain control circuit coupled to the bit compression circuit and the bit decompression circuit, the voltage gain control circuit for controlling gain on the first multi-level protocol signal.

11. The integrated circuit memory of claim 10, comprising timing generator and data path circuitry coupled to the memory storage array and the advanced input/output interface, the timing generator and data path circuitry for generating at least a portion of the first plurality of two-level protocol signals and for receiving the second plurality of two-level protocol signals.

12. The integrated circuit memory of claim 10, wherein the bit compression circuit comprises a signal voltage generator for generating a plurality of signal voltages, each signal voltage corresponding to a respective level in the multi-level protocol.

13. The integrated circuit memory of claim 10, wherein the bit compression circuit comprises a plurality of signal level generating circuits, each signal level generating circuit for outputting a different voltage level on the first multi-level protocol signal.

14. The integrated circuit memory of claim 10, wherein each of the bit compression circuit and the bit decompression circuit utilizes a double data rate technique.

15. A method for interfacing with an integrated circuit memory having a memory storage array accessible by signals formatted in a two-level protocol, the method comprising:
    generating a clock signal within the integrated circuit memory;
    converting a first plurality of signals formatted in the two-level protocol and generated within the integrated circuit memory into a first signal formatted in a multi-level protocol;
    communicating the first multi-level protocol signal out of the integrated circuit memory in synchronization with the clock signal;

receiving from outside the integrated circuit memory a second signal in synchronization with the clock signal, the second signal formatted in the multi-level protocol; and converting the second multi-level protocol signal into a second plurality of signals formatted in the two-level protocol, the second plurality of two-level protocol signals utilized within the integrated circuit memory, wherein converting the second multi-level protocol signal comprises:

sampling a voltage of the second multi-level protocol signal; and comparing the sampled voltage against a reference voltage to output a data latch signal.

16. The method of claim 15, wherein converting the second multi-level protocol signal comprises:

sampling a voltage of the second multi-level protocol signal;

comparing the sampled voltage against a plurality of reference voltages to output a plurality of data latch signals; and decoding the plurality of data latch signals to output the second plurality of two-level protocol signals.

17. The method of claim 15, further comprising automatically controlling gain on the first multi-level protocol signal.

18. An advanced input/output interface for an integrated circuit device in communication with an integrated circuit memory having a memory storage array accessible by signals formatted in a two-level protocol, the advanced input/output interface comprising:

a bit compression circuit for receiving a clock signal and a first plurality of signals formatted in the two-level protocol and generated within the integrated circuit device, the bit compression circuit for converting the first plurality of two-level protocol signals into a first signal formatted in a multi-level protocol, the first multi-level protocol signal communicated out of the integrated circuit device to the integrated circuit memory in synchronization with the clock signal; and a bit decompression circuit for receiving a second signal in synchronization with the clock signal, the second signal formatted in the multi-level protocol, the bit decompression circuit for converting the second multi-level protocol signal into a second plurality of signals formatted in the two-level protocol, the second plurality of two-level protocol signals utilized within the integrated circuit device, wherein the bit decompression circuit comprises a sample and hold comparator for sampling a voltage of the second multi-level protocol signal and holding the sampled voltage for comparison against a reference voltage.

19. An integrated circuit device in communication with an integrated circuit memory having a memory storage array controlled and accessible by signals formatted in a two-level protocol, the integrated circuit device comprising:

a memory controller; and an advanced input/output interface coupled to the memory controller, the advanced input/output interface comprising:

a bit compression circuit for receiving a clock signal and a first plurality of signals formatted in the two-level protocol and generated within the integrated circuit device, the bit compression circuit for converting the first plurality of two-level protocol signals into a first signal formatted in a multi-level protocol, the first multi-level protocol signal communicated out of the integrated circuit device to the integrated circuit memory in synchronization with the clock signal;

a bit decompression circuit for receiving a second signal in synchronization with the clock signal, the second signal formatted in the multi-level protocol, the bit decompression circuit for converting the second multi-level protocol signal into a second plurality of signals formatted in the two-level protocol, the second plurality of two-level protocol signals utilized within the integrated circuit device, wherein the bit decompression circuit comprises a sample and hold comparator for sampling a voltage of the second multi-level protocol signal and holding the sampled voltage for comparison against a reference voltage; and a voltage gain control circuit coupled to the bit compression circuit and the bit decompression circuit, the voltage gain control circuit for controlling gain on the first multi-level protocol signal.

20. The advanced input/output interface of claim 1, wherein the integrated circuit memory, the bit compression circuit, and the bit decompression circuit are formed on a common substrate.

21. The advanced input/output interface of claim 1, wherein the integrated circuit memory, the bit compression circuit, and the bit decompression circuit are provided within a common module.

22. An apparatus for establishing communications over a communication path between a first logic or storage element and a second logic or storage element, the first and second logic or storage elements and the communications path being located within a common interconnect plane, the apparatus comprising:

a first circuit at a first location along the communications path for receiving signals formatted in a two-level protocol from the first logic or storage element and for outputting signals corresponding thereto that are in a multi-level protocol to the communications path where both receiving and outputting are performed synchronously with a clock signal;

the first circuit also receiving signals formatted in a multi-level protocol from the communications path and outputting signals corresponding thereto that are formatted in the two-level protocol to the first logic or storage element where both receiving and outputting are performed synchronously with the clock signal;

wherein the first circuit comprises a sample and hold comparator for sampling voltages of the received signals formatted in the multi-level protocol and holding the sampled voltage for comparison against a reference voltage.

23. The apparatus of claim 22, further comprising:

a second circuit at a second location along the communications path for receiving signals formatted in the two-level protocol from the second logic or storage element and for outputting signals corresponding thereto that are formatted in a multi-level protocol to the communications path;

the second circuit also receiving signals formatted in a multi-level protocol from the communications path and outputting signals corresponding thereto that are formatted in the two-level protocol to the second logic or storage element.

24. A memory architecture, comprising:

a memory circuit that is accessible by signals formatted in a two-level protocol;

a logic circuit accessible by signals formatted in the two-level protocol;

the memory circuit and the logic circuit being separated within a common module by a communications path that exchanges data using a multi-level protocol;

a first interface circuit associated with the memory circuit and being located along the communications path proximate to the memory circuit;

a second interface circuit associated with the logic circuit and being located along the communications path proximate to the logic circuit; and the first and second interface circuits converting data between the multi-level protocol and the two-level protocol in synchronization with a clock signal to establish data exchange between the communications path and a respective memory circuit or logic circuit, wherein each of the first and second interface circuits comprises a respective sample and hold comparator for sampling voltages of signals formatted in the multi-level protocol and holding the sampled voltage for comparison against at least one reference voltage.

25. A method for interfacing with an integrated circuit memory having a memory storage array accessible by signals formatted in a two-level protocol, the method comprising:

converting a first plurality of signals formatted in the two-level protocol and generated within the integrated circuit memory into a first signal formatted in a multi-level protocol;

communicating the first multi-level protocol signal out of the integrated circuit memory in synchronization with a clock signal;

receiving from outside the integrated circuit memory a second signal in synchronization with the clock signal, the second signal formatted in the multi-level protocol; and converting the second multi-level protocol signal into a second plurality of signals formatted in the two-level protocol, the second plurality of two-level protocol signals utilized within the integrated circuit memory, wherein converting comprises:

sampling a voltage of the second multi-level protocol signal; and comparing the sampled voltage against a reference voltage to output a data latch signal.

\* \* \* \* \*